United States Patent
Yang et al.

(10) Patent No.: US 10,992,871 B2
(45) Date of Patent: Apr. 27, 2021

(54) METHOD AND APPARATUS FOR PROTECTING DEVICE UNDER STRONG LIGHT

(71) Applicant: Hangzhou Hikmicro Sensing Technology Co., Ltd., Hangzhou Zhejiang (CN)

(72) Inventors: Wei Yang, Zhejiang (CN); Haixun Guo, Zhejiang (CN); Qiyi Song, Zhejiang (CN); Jie Tang, Zhejiang (CN)

(73) Assignee: Hangzhou Hikmicro Sensing Technology, Co., Ltd.

( * ) Notice: Subject to any disclaimer, the term of this patent is extended or adjusted under 35 U.S.C. 154(b) by 83 days.

(21) Appl. No.: 16/333,119

(22) PCT Filed: Jan. 15, 2018

(86) PCT No.: PCT/CN2018/072565
§ 371 (c)(1),
(2) Date: Mar. 13, 2019

(87) PCT Pub. No.: WO2018/133753
PCT Pub. Date: Jul. 26, 2018

(65) Prior Publication Data
US 2019/0364218 A1    Nov. 28, 2019

(30) Foreign Application Priority Data

Jan. 17, 2017   (CN) .......................... 201710031314.1

(51) Int. Cl.
*H04N 5/232*    (2006.01)
*H04N 5/235*    (2006.01)
(Continued)

(52) U.S. Cl.
CPC ... *H04N 5/23299* (2018.08); *H01L 27/14603* (2013.01); *H04N 5/238* (2013.01); *H04N 5/2353* (2013.01)

(58) Field of Classification Search
CPC .. H04N 5/23299; H04N 5/2353; H04N 5/238; H01L 27/14603
See application file for complete search history.

(56) References Cited

U.S. PATENT DOCUMENTS

| 5,111,036 A | 5/1992 | Dibble |
| 6,281,927 B1 | 8/2001 | Otto et al. |

(Continued)

FOREIGN PATENT DOCUMENTS

| CN | 101428590 A | * | 5/2009 |
| CN | 101428590 A | | 5/2009 |

(Continued)

OTHER PUBLICATIONS

English translated PCT Search Report, PCT International Application No. PCT/CN2018/072565, dated Apr. 12, 2018, 2 pages.

*Primary Examiner* — Sinh Tran
*Assistant Examiner* — Zhenzhen Wu
(74) *Attorney, Agent, or Firm* — McDonnell Boehnen Hulbert & Berghoff LLP

(57) ABSTRACT

A method and an apparatus for protecting a device under powerful light are disclosed. It is determined whether there is a powerful light source in an image captured by a camera device based on the number of target pixels (pixels whose gray values are larger than the first preset threshold) in the image. If so, it is indicated that the photosensitive element in the camera device is aligned with the powerful light source. In this case, the light avoidance instruction is sent, so as to cause a photosensitive element of the camera device to avoid the light source, thereby reducing the damage (Continued)

caused by the powerful light to the photosensitive element in the camera device.

9 Claims, 5 Drawing Sheets

(51) Int. Cl.
*H01L 27/146* (2006.01)
*H04N 5/238* (2006.01)

(56) References Cited

U.S. PATENT DOCUMENTS

| | | | |
|---|---|---|---|
| 10,686,984 B1 * | 6/2020 | Schmidt | H04N 5/2259 |
| 2006/0290957 A1 * | 12/2006 | Kim | H04N 1/608 |
| | | | 358/1.9 |
| 2009/0010494 A1 * | 1/2009 | Bechtel | G01S 11/12 |
| | | | 382/104 |
| 2011/0181690 A1 * | 7/2011 | Yoshizumi | H04N 5/2252 |
| | | | 348/37 |
| 2013/0229521 A1 * | 9/2013 | Siecke | H04N 5/2351 |
| | | | 348/148 |
| 2015/0222800 A1 | 8/2015 | Hirooka et al. | |
| 2015/0253198 A1 * | 9/2015 | Bergen | H04N 5/35581 |
| | | | 250/206.1 |
| 2017/0177000 A1 * | 6/2017 | Meyhofer | H04N 5/2257 |

FOREIGN PATENT DOCUMENTS

| | | |
|---|---|---|
| CN | 101650254 A | 2/2010 |
| CN | 102889932 A | 1/2013 |
| CN | 202649396 U | 1/2013 |
| CN | 104822011 A | 8/2015 |
| CN | 105337180 A | 2/2016 |
| CN | 105424197 A | 3/2016 |
| CN | 105678744 A | 6/2016 |
| GB | 934 760 A | 8/1963 |
| JP | 2007-142924 A | 6/2007 |
| KR | 10-2008-0000236 A | 1/2008 |

\* cited by examiner

METHOD AND APPARATUS FOR PROTECTING DEVICE UNDER STRONG LIGHT

The present application is a US national phase under 35 U.S.C. 371 of international application PCT/CN2018/072565, filed Jan. 15, 2018, which claims priority to Chinese Patent Application No. 201710031314.1, filed with the State Intellectual Property Office of the People's Republic of China on Jan. 17, 2017 and entitled "Method and apparatus for protecting a device under powerful light", which is incorporated herein by reference in their entirety.

TECHNICAL FIELD

The application relates to the technical field of image capture devices, and in particular, to a method and apparatus for protecting a device under powerful light.

BACKGROUND

Powerful light is often present in working environment of a camera device. A photosensitive element in a camera device is a precision component. If the photosensitive element is aligned with a powerful light source, the photosensitive element is easily damaged by powerful light.

SUMMARY

Embodiments of the disclosure provide a method and apparatus for protecting a device under powerful light, so as to reduce the damage caused by the powerful light to a photosensitive element in the camera device.

An embodiment of the disclosure discloses a method for protecting a device under powerful light, including:

acquiring gray values of pixels in a first image captured by the camera device;

determining pixels whose gray values are larger than a first preset threshold as target pixels;

determining whether the number of the target pixels is larger than a second preset threshold; and if the number of the target pixels is larger than the second preset threshold, sending a light avoidance instruction so as to cause a photosensitive element of the camera device to avoid a light source.

In one embodiment, the light avoidance instruction is an instruction for rotating the camera device or an instruction for closing a shutter of the camera device, and sending a light avoidance instruction, includes:

sending the instruction for rotating the camera device so as to cause the camera device to rotate in a direction away from the light source based on the instruction for rotating the camera device; or, sending the instruction for closing a shutter of the camera device so as to cause the shutter to shield a photosensitive element of the camera device.

In one embodiment, the light avoidance instruction is an instruction for rotating the camera device or an instruction for closing a shutter of the camera device, and sending a light avoidance instruction, includes:

determining whether the camera device is rotatable;

if the camera device is rotatable, sending the instruction for rotating the camera device so as to cause the camera device to rotate in a direction away from the light source based on the instruction for rotating the camera device;

if the camera device is not rotatable, sending the instruction for closing a shutter of the camera device so as to cause the shutter to shield the photosensitive element of the camera device.

In one embodiment, sending the instruction for rotating the camera device includes:

determining a position of the light source based on the first image;

determining a rotation path of the camera device away from the position;

sending the instruction for rotating the camera device which carries information of the rotation path, so as to cause the camera device to rotate in the direction away from the position based on the information of the rotation path.

In one embodiment, after sending the instruction for rotating the camera device, the method further includes:

activating a timer, and after a third preset duration, sending a return instruction; wherein the return instruction carries information of a return path, so as to cause the camera device to return to an initial position based on the information of the return path, and the initial position is: a position where the camera device is located before rotating based on the information of the rotation path.

In one embodiment, after sending a return instruction, the method further includes:

acquiring a fourth image captured by the camera device and gray values of pixels in the fourth image;

determining pixels whose gray values are larger than the first preset threshold as target pixels;

determining whether the number of the target pixels is larger than the second preset threshold; and if the number of the target pixels is larger than the second preset threshold, returning to the step of sending the instruction for rotating the camera device.

In one embodiment, after sending the instruction for rotating the camera device, the method further includes:

activating a timer, and after a first preset duration, acquiring a second image captured by the camera device;

acquiring gray values of pixels in the second image;

determining pixels whose gray values are larger than the first preset threshold as target pixels;

determining whether the number of the target pixels is larger than the second preset threshold; and if the number of the target pixels is larger than the second preset threshold, sending the instruction for closing a shutter of the camera device so as to cause the shutter to shield the photosensitive element of the camera device.

In one embodiment, after sending the instruction for closing a shutter of the camera device, the method further includes:

activating a timer, and after a second preset duration, sending an instruction for opening the shutter and acquiring a third image captured by the camera device;

acquiring gray values of pixels in the third image;

determining pixels whose gray values are larger than the first preset threshold as target pixels;

determining whether the number of the target pixels is larger than the second preset threshold; and if the number of the target pixels is larger than the second preset threshold, sending the instruction for closing the shutter of the camera device.

In one embodiment, determining whether the camera device is rotatable may include:

determining whether a rotation component is provided in the camera device;

or, reading hardware configuration information of the camera device, and determining whether the camera device is rotatable based on the hardware configuration information.

In one embodiment, sending an instruction for rotating the camera device may include:

determining, in the first image, an image region whose gray value is larger than a third preset threshold as a position of the light source in the first image;

determining a rotation path of the camera device away from the light source based on the position of the light source in the first image; and sending the instruction for rotating the camera device which carries, information of the rotation path so as to cause the camera device to rotate in the direction away from the light source based on the information of the rotation path.

An embodiment of the disclosure further discloses an apparatus for protecting a device under powerful light, including:

a first acquisition module, configured to acquire gray values of pixels in a first image captured by the camera device;

a first determining module, configured to determine pixels whose gray values are larger than a first preset threshold as target pixels;

a first judgment module, configured to determine whether the number of the target pixels is larger than a second preset threshold, and trigger a first sending module if the number of the target pixels is larger than the second preset threshold; and the first sending module, configured to send a light avoidance instruction so as to cause a photosensitive element of the camera device to avoid a light source.

In one embodiment, the light avoidance instruction is an instruction for rotating the camera device or an instruction for closing a shutter of the camera device. When the light avoidance instruction is the instruction for rotating the camera device, the first sending module includes a first sending sub-module. When the light avoidance instruction is the instruction for closing a shutter of the camera device, the first sending module includes a second sending sub-module.

The first sending sub-module is configured to send the instruction for rotating the camera device so as to cause the camera device to rotate in the direction away from the light source based on the instruction for rotating the camera device.

The second sending sub-module is configured to send the instruction for closing a shutter of the camera device so as to cause the shutter to shield the photosensitive element of the camera device.

In one embodiment, the light avoidance instruction is an instruction for rotating the camera device or an instruction for closing a shutter of the camera device; the first sending module includes a judgment sub-module, a third sending sub-module and a fourth sending sub-module; wherein, the judgment sub-module is configured to determine whether the camera device is rotatable, and trigger the third sending sub-module if the camera device is rotatable, or trigger the fourth sending sub-module if the camera device is not rotatable;

the third sending sub-module is configured to send the instruction for rotating the camera device so as to cause the camera device to rotate in the direction away from the light source based on the instruction for rotating the camera device; and the fourth sending sub-module is configured to send the instruction for closing the shutter of the camera device so as to cause the shutter to shield the photosensitive element of the camera device.

In one embodiment, the first sending sub-module or the third sending sub-module includes:

a first determining unit configured to determine a position of the light source based on the first image;

a second determining unit configured to determine a rotation path of the camera device away from the position; and a sending unit configured to send the instruction for rotating the camera device which carries information of the rotation path, so as to cause the camera device to rotate in the direction away from the position based on the information of the rotation path.

In one embodiment, the apparatus further includes:

a third sending module, configured to activate a timer after the third sending sub-module sends the instruction for rotating the camera device, and send a return instruction after the third preset duration; wherein the return instruction carries information of a return path, so as to cause the camera device to return to an initial position based on the information of the return path, and the initial position is: a position where the camera device is located before rotating based on the information of the rotation path.

In one embodiment, the apparatus further includes:

a fifth acquisition module configured to acquire a fourth image captured by the camera device and gray values of pixels in the fourth image;

a fourth determining module configured to determine pixels whose gray values are larger than a first preset threshold as target pixels;

a fourth judgment module configured to determine whether the number of the target pixels is larger than the second preset threshold, and trigger the sending module if the number of the target pixels is larger than the second preset threshold.

In one embodiment, the apparatus further includes:

a first timing module configured to activate a timer after the first sending sub-module sends the instruction for rotating the camera device, and after the first preset duration, trigger the second acquisition module;

a second acquisition module configured to acquire a second image captured by the camera device;

a third acquisition module configured to acquire gray values of pixels in the second image;

a second determining module configured to determine pixels whose gray values are larger than a first preset threshold as target pixels; and a second judgment module configured to determine whether the number of the target pixels is larger than the second preset threshold, and trigger the second sending sub-module if the number of the target pixels is larger than the second preset threshold.

In one embodiment, the apparatus further includes:

a second timing module configured to activate a timer after the second sending sub-module or the fourth sending sub-module sends the instruction for closing a shutter of the camera device, and after the second preset duration, trigger the second sending module;

a second sending module configured to send an instruction for opening the shutter and acquire a third image captured by the camera device;

a fourth acquisition module configured to acquire gray values of pixels in the third image;

a third determining module configured to determine pixels whose gray values are larger than a first preset threshold as target pixels; and a third judgment module configured to determine whether the number of the target pixels is larger than the second preset threshold, and trigger the second sending sub-module if the number of the target pixels is larger than the second preset threshold.

An embodiment of the disclosure further discloses a camera device including a processor, a communication interface, a memory and a communication bus;

wherein, the processor, the communication interface, and the memory are communicated with each other via the communication bus;

the memory is configured to store a computer program; and the processor is configured to implement any one of the above-described methods for protecting a device under powerful light when executing the program stored in the memory.

An embodiment of the disclosure further discloses a computer readable storage medium. The computer readable storage medium stores a computer program therein. The computer program, when executed by a processor, implements any one of the above-described methods for protecting a device under powerful light.

An embodiment of the disclosure further discloses a computer program. The computer program, when executed by a processor, implements any one of the above-described methods for protecting a device under powerful light.

In the embodiment of the disclosure, it is determined whether there is a powerful light source in an image captured by the camera device based on the number of the target pixels (pixels whose gray values are larger than the first preset threshold) in the image. If so, it is indicated that the photosensitive element in the camera device is aligned with the powerful light source. In this case, the light avoidance instruction is sent, so as to cause the photosensitive element of the camera device to avoid the light source, thereby reducing the damage caused by the powerful light to the photosensitive element in the camera device.

BRIEF DESCRIPTION OF THE DRAWINGS

In order to more clearly describe the technical solutions of the embodiments of the disclosure and the prior art, drawings that need to be used in embodiments and the prior art will be briefly described below. Obviously, the drawings described below are for only some embodiments of the disclosure; those skilled in the art can also obtain other drawings based on these drawings without any creative efforts.

DETAILED DESCRIPTION

The disclosure will be described in more detail below with reference to the appended drawings and embodiments. Obviously, the described embodiments are only some, and not all, of the embodiments of the disclosure. All other embodiments obtained based on the embodiments of the disclosure by those skilled in the art without any creative efforts fall into the scope of protection defined by the disclosure.

The embodiments of the disclosure provide a method and apparatus for protecting a device under powerful light. The method and apparatus is applicable to a camera device, and is also applicable to an individual electronic device.

The method for protecting a device under powerful light according to an embodiment of the disclosure is described firstly in detail below.

Figure 1:
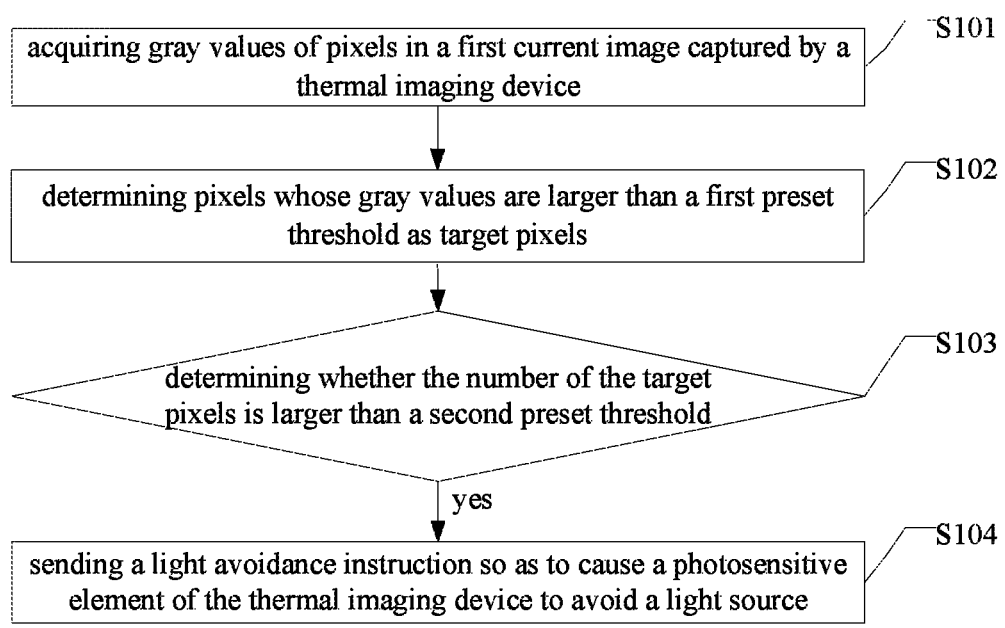
FIG. 1 is a flowchart of an exemplary method for protecting a device under powerful light according to one embodiment.

FIG. 1 is a first schematic flowchart of a method for protecting a device under powerful light according to an embodiment of the disclosure, the method includes S101-S104.

S101: Acquiring a gray value of each of pixels in a first image captured by a camera device.

As described above, the device implementing the present solution can be a camera device, and the camera device can analyze its captured image to acquire a gray value of each of pixels in the image.

Alternatively, the device implementing the present solution can also be an independent electronic device. The electronic device is communicatively connected to the camera device, acquires and analyzes an image captured by the camera device, and acquires a gray value of each of pixels in the image.

S102: Determining pixels, in the first image, whose gray values are larger than a first preset threshold as target pixels.

The first preset threshold can be set based on actual conditions. For example, if a photosensitive element in the camera device is very sensitive, and thus may be damaged by slightly powerful light, the first preset threshold can be set to be a smaller value. If the photosensitive element in the camera device is not very sensitive, and thus can be damaged by only powerful light, the first preset threshold can be set to be a larger value.

S103: Determining whether the number of the target pixels is larger than a second preset threshold, and if so, performing S103.

The second preset threshold can be set based on actual conditions. For example, if a photosensitive element in the camera device is very sensitive, and thus may be damaged by slightly powerful light, the second preset threshold can be set to be a smaller value. If the photosensitive element in the camera device is not very sensitive, and thus can be damaged by only powerful light, the second preset threshold can be set to be a larger value.

S104: Sending a light avoidance instruction so as to cause a photosensitive element of the camera device to avoid a light source.

As an implementation, the light avoidance instruction can be an instruction for rotating the camera device or an instruction for closing the shutter of the camera device. S104 may include:

sending the instruction for rotating the camera device so as to cause the camera device to rotate in a direction away from the light source; or, sending the instruction for closing the shutter of the camera device so as to cause the shutter to shield the photosensitive element of the camera device.

As another implementation, S104 may include: determining whether the camera device is rotatable; if the camera device is rotatable, sending the instruction for rotating the camera device so as to cause the camera device to rotate in the direction away from the light source; if the camera device is not rotatable, sending the instruction for closing the shutter of the camera device so as to close the shutter to shield the photosensitive element of the camera device.

For example, it can be determined whether a rotation component is provided in the camera device; or, hardware configuration information of the camera device can be read, and then it can be determined whether the camera device is rotatable based on the hardware configuration information.

If it is determined that the number of the target pixels is larger than the second preset threshold in S103, it is indicated that the camera device is currently under powerful light. In this case, the following protection schemes can be adopted.

In a first scheme, the device implementing the present solution may determine, in the first image, an image region whose gray value is larger than a third preset threshold as a position of the light source in the first image, determine a rotation path of the camera device away from the light source based on the position of the light source in the first image, and send the instruction for rotating the camera device, which carries information of the rotation path, so as to cause the camera device to rotate in the direction away from the light source based on the information of the rotation path.

The gray values of the pixels at the position of the light source in the first image are relatively large. Therefore, a region whose gray value is relatively large can be identified in the first image as the position of the light source. For example, a region in which a gray value of each pixel is larger than the third preset threshold can be identified as the position of the light source in the first image. A region in which an average gray value of pixels is larger than the third preset threshold can be identified as the position of the light source in the first image. The specific identification method is not limited thereto.

Based on the position of the light source in the first image, the rotation path of the camera device is determined. Specifically, the rotation path can include a rotation angle and a rotation direction. The rotation angle can be a fixed value, such as 180 degrees, 90 degrees, etc., which is not specifically limited. Alternatively, the rotation angle can also be a dynamic value. For example, the rotation angle can be determined based on the position of the light source in the first image. The rotation direction can be preset. For example, the camera device can rotate clockwise in a horizontal direction, counterclockwise in a horizontal direction, or up and down. The specific rotation direction is not limited thereto. Alternatively, the rotation direction can be determined based on the position of the light source in the first image.

As an implementation, the coordinates of the circumscribed rectangle of the light source in the first image can be determined, and then, based on the coordinates of the circumscribed rectangle, the shortest path to remove the light source from the field of view is calculated; wherein, the shortest path includes the rotation angle and the rotation direction. In this way, the rotation path is determined.

As a simple example, it is assumed that the camera device is horizontally rotated, and the camera device can be clockwise or counterclockwise rotated. It is assumed that the correspondence between the size of the circumscribed rectangle and the rotation angle is pre-stored, and the larger the circumscribed rectangle is, the larger the rotation angle is. It is assumed that the first image is 160 mm long and 120 mm high, and the determined circumscribed rectangle of the light source in the first image are located in the upper left corner. It is assumed that a point at the most upper left corner is taken as the origin in the image coordinate system of the first image and the coordinates of the four points of the circumscribed rectangle are (0,0), (0,1), (1,0) and (1,1) respectively.

The light source is in the upper left corner in the first image, and is rotated to the right (i.e., in a direction away from the light source), that is, clockwise rotated. Here, assuming that the rotation angle is determined to be 10 degrees based on the size of the circumscribed rectangle, the information of the rotation path carried in the sent instruction for rotating the camera device includes: the camera device is clockwise rotated by 10 degrees.

In the second scheme, the device implementing the present solution sends the instruction for closing the shutter of the camera device to the camera device. After receiving the instruction for closing the shutter of the camera device, the camera device closes its shutter. In this way, the shutter can shield the light source so as to provide the shielding protection of the photosensitive element.

In the embodiment shown in FIG. 1, it is determined whether a powerful light source exists in an image captured by the camera device based on the number of the target pixels (the pixels whose gray values are larger than the first preset threshold) in the image. If so, it is indicated that the photosensitive element in the camera device is aligned with the powerful light source. In this case, the light avoidance instruction is sent, so as to cause the photosensitive element of the camera device to avoid the light source, thereby reducing the damage caused by the powerful light to the photosensitive element in the camera device.

Figure 2:
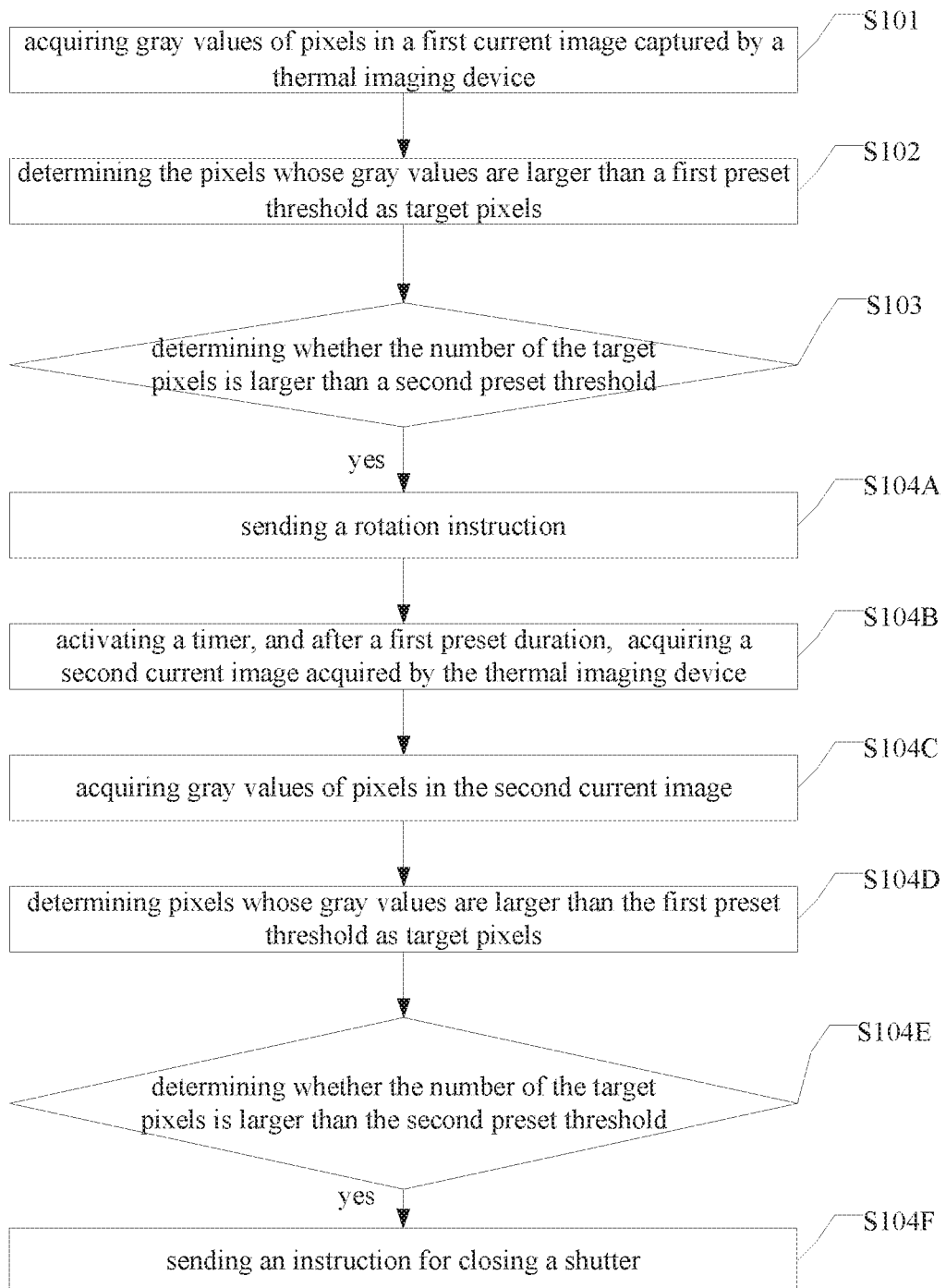
FIG. 2 is a flowchart showing an exemplary method for protecting a device under powerful light when said device is rotatable according to one embodiment.

FIG. 2 is a second schematic flowchart of a method for protecting a device under powerful light according to an embodiment of the disclosure. The embodiment shown in FIG. 2 is based on the embodiment shown in FIG. 1. S104 may include:

S104A: Sending the instruction for rotating the camera device.

S104B: Activating a timer, and when a first preset duration elapses, that is, after the first preset duration, acquiring a second image captured by the camera device.

S104C: Acquiring gray values of pixels in the second image.

S104D: Determining pixels whose gray values are larger than the first preset threshold as target pixels.

S104E: Determining whether the number of the target pixels is larger than the second preset threshold; if the number of the target pixels is larger than the second preset threshold, performing S104F.

S104F: Sending an instruction for closing the shutter of the camera device so as to cause the shutter to shield the photosensitive element of the camera device.

That is to say, in the embodiment shown in FIG. 2, if the determination result in S103 is YES, the instruction for rotating the camera device is firstly sent, and after the preset duration (for example, 3 seconds) after sending the instruction for rotating the camera device, an image captured by the camera device is again acquired. For ease of description, the image acquired in S101 is referred to as the first image, and the image acquired in S104B is referred to as the second image. It can be understood that the moment for acquiring the first image is earlier than the moment for acquiring the second image.

The processing of the second image is similar to that of the first image. It is determined whether the number of the target pixels in the second image is larger than the second preset threshold. If so, it is indicated that the camera device is still under the powerful light, that is to say, it is not possible to reduce the powerful light radiation of the camera device by rotating the camera device.

In this case, the instruction for closing the shutter of the camera device is sent to the camera device. After receiving the instruction for closing the shutter of the camera device, the camera device closes its shutter. In this way, the shutter can shield the light source so as to provide the shielding protection of the photosensitive element.

It should be noted that in the embodiment shown in FIG. 2, if it is determined that it is not possible to reduce the powerful light radiation of the camera device by rotating the camera device, this can be recorded. When this scheme is implemented later, in the case where it is determined in S103 that the number of the target pixels is larger than the second preset threshold, it is possible to directly send the instruction for closing the shutter of the camera device, instead of sending the instruction for rotating the camera device.

In the embodiment shown in FIG. 2, after S104F, the method may further include:

Activating a timer, and when a second preset duration elapses, that is, after the second preset duration, sending an instruction for opening the shutter and acquiring a third image captured by the camera device;

acquiring gray values of pixels in the third image;

determining pixels whose gray values are larger than the first preset threshold as the target pixels;

determining whether the number of the target pixels is larger than the second preset threshold; and if the number of the target pixels is larger than the second preset threshold, sending the instruction for closing the shutter of the camera device.

That is to say, after the second preset duration (which may be the same as or different from the first preset duration) after sending the instruction for closing the shutter of the camera device to the camera device, for example 2 minutes, the instruction for opening the shutter is sent to the camera device.

It can be understood that, after 2 minutes, the powerful light source may be already not within the field of view. In this case, the image captured by the camera device is acquired again. For ease of description, the image acquired at this time is referred to as the third image. It can be understood that the moment for acquiring the third image is later than the moment for acquiring the second image and the moment for acquiring the first image.

The processing of the third image is similar to that of the second image. It is determined whether the number of the target pixels in the third image is larger than the second preset threshold. If so, it is indicated that the camera device is still under the powerful light, and at this time, the instruction for closing the shutter is sent to the camera device to close the shutter again. If not, it is indicated that the powerful light source is already not within the field of view, and at this time, the shutter is no longer closed.

Figure 3:
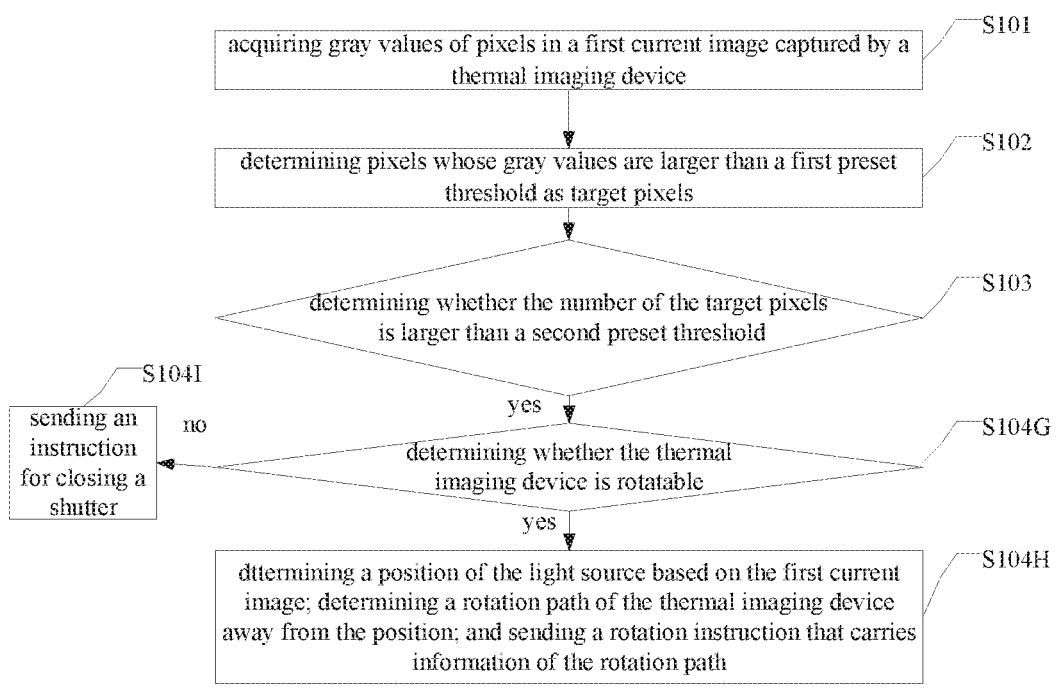
FIG. 3 is a flowchart showing an exemplary method for protecting a device under powerful light as to determine whether the device is rotatable according to one embodiment.

FIG. 3 is a third schematic flowchart of a method for protecting a device under powerful light according to an embodiment of the disclosure. The embodiment shown in FIG. 3 is based on the embodiment shown in FIG. 1. S104 may include: S104G: determining whether the camera device is rotatable; if the camera device is rotatable, performing S104H; if the camera device is not rotatable, performing S104I.

As an implementation, in the embodiment shown in FIG. 2, when it is determined that it is not possible to reduce the powerful light irradiation of the camera device by rotating the camera device, it is recorded that it is not possible to reduce the powerful light irradiation of the camera device by rotating the camera device. Therefore, at this time, it can be determined whether the camera device can rotate by means of the recorded content.

Alternatively, other implementations can also be adopted. For example, it is detected whether a rotation component (or rotation module, etc.) is provided in a thermal imaging device, and if so, it is indicated that the thermal imaging device is rotatable; or, the hardware configuration information of the thermal imaging device can also be read, and whether the thermal imaging device is rotatable is determined based on the hardware configuration information, and so on. The specific determination method is not limited thereto.

S104H: Determining a position of the light source based on the first image; determining a rotation path of the camera device away from the position; and sending the instruction for rotating the camera device, which carries information of the rotation path, so as to cause the camera device to rotate in the direction away from the position based on the information of the rotation path.

S104I: Sending an instruction for closing the shutter of the camera device so as to the shutter to shield the photosensitive element of the camera device.

If the camera device is rotatable, the device implementing the present solution can determine the position of the light source based on the first image, then determine the rotation path of the camera device away from the position, and send the instruction for rotating the camera device, which carries information of the rotation path. After receiving the instruction for rotating the camera device, the camera device rotates in the direction away from the position based on the information of the rotation path.

As an implementation, in determining the position of the light source, the coordinates of the circumscribed rectangle of the light source in the first image can be determined; and then, based on the coordinates of the circumscribed rectangle, the shortest path to remove the light source from the field of view is calculated. In this way, the rotation path is determined.

If the camera device is not rotatable, the device implementing the present solution can send the instruction for closing the shutter of the camera device to the camera device. After receiving the instruction for closing the shutter of the camera device, the camera device closes its shutter. In this way, the shutter can shield the light source so as to provide the shielding protection of the photosensitive element.

In the embodiment shown in FIG. 3, after S104I, the method may further include:

Activating a timer, and when the second preset duration elapses, that is, after the second preset duration, sending the instruction for opening the shutter and acquiring a third image captured by the camera device;

acquiring gray values of pixels in the third image;

determining pixels whose gray values are larger than the first preset threshold as the target pixels;

determining whether the number of the target pixels is larger than the second preset threshold; and if the number of the target pixels is larger than the second preset threshold, sending the instruction for closing the shutter of the camera device.

That is to say, after the second preset duration (which may be the same as or different from the first preset duration) after sending the instruction for closing the shutter of the camera device to the camera device, for example 2 minutes, the instruction for opening the shutter is sent to the camera device.

It can be understood that, after 2 minutes, the powerful light source may be already not within the field of view. In this case, the image captured by the camera device is acquired again. For ease of description, the image acquired at this time is referred to as the third image. It can be understood that the moment for acquiring the third image is later than the moment for acquiring the second image and the moment for acquiring the first image.

The processing of the third image is similar to that of the second image. It is determined whether the number of the target pixels in the third image is larger than the second preset threshold. If so, it is indicated that the camera device is still under the powerful light, and at this time, the instruction for closing the shutter of the camera device is sent to close the shutter again. If not, it is indicated that the powerful light source is already not within the field of view, and at this time, the shutter is no longer closed.

Figure 4:
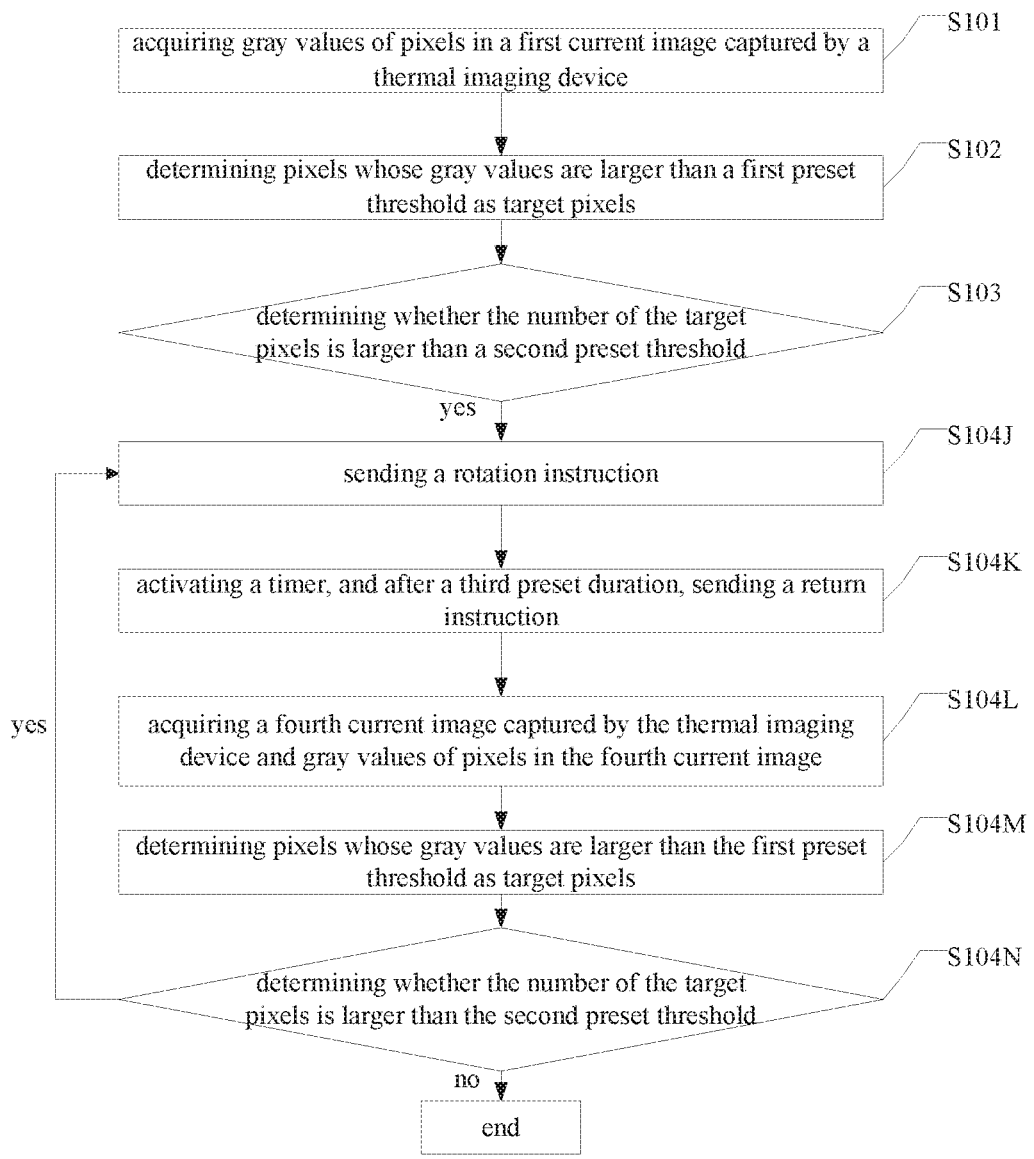
FIG. 4 is a flowchart showing a further exemplary method for protecting a device under powerful light when the device is rotatable according to one embodiment.

FIG. 4 is a fourth schematic flowchart of a method for protecting a device under powerful light according to an embodiment of the disclosure. The embodiment shown in FIG. 4 is based on the embodiment shown in FIG. 1. S104 may include:

S104J: sending the instruction for rotating the camera device.

S104K: Activating a timer, and when a third preset duration elapses, that is, after the third preset duration, sending a return instruction.

The return instruction carries information of a return path, so that the camera device returns to an initial position based on the information of the return path. The initial position is: a position where the camera device is located before it rotates based on the information of the rotation path.

S104L: Acquiring a fourth image captured by the camera device and gray values of pixels in the fourth image.

S104M: Determining pixels whose gray values are larger than the first preset threshold as the target pixels.

S104N: Determining whether the number of the target pixels is larger than the second preset threshold. If the number of the target pixels is larger than the second preset threshold, returning to S104J; and if the number of the target pixels is not larger than the second preset threshold, it is indicated that there is no powerful light source in the field of view of the camera device, and the process ends.

That is to say, in the embodiment shown in FIG. 4, if the determination result in S103 is YES, the instruction for rotating the camera device is firstly sent, and after the preset duration (for example 1 minute) after sending the instruction for rotating the camera device, the return instruction is then sent, so that the camera device returns to the initial position, that is, the position where the camera device is located before rotating based on the above-described information of the rotation path.

After returning to the initial position, the camera device acquires the image captured by the camera device again. For ease of description, the image acquired in S104L is referred to as the fourth image. It can be understood that the moment for acquiring the first image is earlier than the moment for acquiring the fourth image.

The processing of the fourth image is similar to that of the first image. It is determined whether the number of the target pixels in the fourth image is larger than the second preset threshold. If so, it is indicated that the camera device is still under the powerful light. In this case, it is indicated that the powerful light source is still present, and the instruction for rotating the camera device is sent to the camera device again to make it away from the powerful light source.

Alternatively, S104K-S104N in FIG. 4 can also be added on the basis of the embodiment shown in FIG. 3 and S104K-S104N are performed after S104H. If the determination result in S104N is YES, the process returns to S104H. If the determination result in S104N is NO, the process ends. The specific process is similar and thus to not be repeated.

Corresponding to the above-described method embodiment, an embodiment of the disclosure also provides an apparatus for protecting a device under powerful light.

Figure 5:
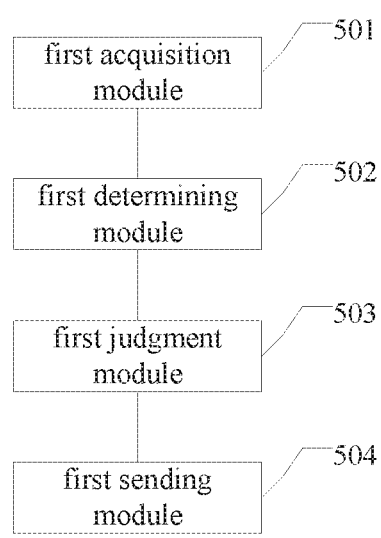
FIG. 5 is a schematic structural diagram of an apparatus for protecting a device under powerful light according to one embodiment.

FIG. 5 is a schematic structural diagram of an apparatus for protecting a device under powerful light according to an embodiment of the disclosure, the apparatus includes:

a first acquisition module 501, configured to acquire gray values of pixels in a first image captured by the camera device;

a first determining module 502, configured to determine pixels whose gray values are larger than a first preset threshold as target pixels;

a first judgment module 503, configured to determine whether the number of the target pixels is larger than a second preset threshold, and trigger a first sending module 504 if the number of the target pixels is larger than the second preset threshold; and the first sending module 504, configured to send a light avoidance instruction so as to cause the photosensitive element of the camera device to avoid a light source.

In the present embodiment, the light avoidance instruction is an instruction for rotating the camera device or an instruction for closing a shutter of the camera device. When the light avoidance instruction is an instruction for rotating the camera device, the first sending module includes a first sending sub-module. When the light avoidance instruction is an instruction for closing a shutter of the camera device, the first sending module includes a second sending sub-module.

The first sending sub-module, configured to send the instruction for rotating the camera device so as to cause the camera device to rotate in a direction away from the light source based on the instruction for rotating the camera device.

The second sending sub-module, configured to send the instruction for closing a shutter of the camera device so as to the shutter to shield the photosensitive element of the camera device.

In the present embodiment, the light avoidance instruction is an instruction for rotating the camera device or an instruction for closing a shutter of the camera device. The first sending module 504 includes a judgment sub-module, a third sending sub-module and a fourth sending sub-module (not shown in the figure), wherein, the judgment sub-module is configured to determine whether the camera device is rotatable, and trigger the third sending sub-module if the camera device is rotatable, or trigger the fourth sending sub-module if the camera device is not rotatable;

the third sending sub-module is configured to send the instruction for rotating the camera device, so as to cause the camera device to rotate in the direction away from the light source based on the instruction for rotating the camera device;

the fourth sending sub-module is configured to send the instruction for closing a shutter of the camera device so as to the shutter to shield the photosensitive element of the camera device.

In the present embodiment, the first sending sub-module or the third sending sub-module may include: a first determining unit, a second determining unit and a sending unit (not shown in the figure), wherein, the first determining unit is configured to determine a position of the light source based on the first image;

the second determining unit is configured to determine a rotation path of the camera device away from the position; and the sending unit is configured to send the instruction for rotating the camera device which carries information of the rotation path, so as to cause the camera device to rotate in the direction away from the position based on the information of the rotation path.

In the present embodiment, the apparatus may further include:

a third sending module (not shown in the figure), configured to activate a timer when the third sending sub-module sends the instruction for rotating the camera device, and after the third preset duration, send a return instruction; wherein the return instruction carries information of a return path, so as to cause the camera device to return to an initial position based on the information of the return path, and the initial position is: a position where the camera device is located before rotating based on the information of the rotation path;

In the present embodiment, the apparatus may further include: a fifth acquisition module, a fourth determining module and a fourth judgment module (not shown in the figure), wherein, the fifth acquisition module is configured to acquire a fourth image captured by the camera device and gray values of pixels in the fourth image;

the fourth determining module is configured to determine pixels whose gray values are larger than a first preset threshold as target pixels; and the fourth judgment module is configured to determine whether the number of the target pixels is larger than the second preset threshold, and trigger the sending module if the number of the target pixels is larger than the second preset threshold.

In the present embodiment, the apparatus may further include: a first timing module, a second acquisition module, a third acquisition module, a second determining module and a second judgment module (not shown in the figure), wherein, the first timing module is configured to activate a timer after the first sending sub-module sends the instruction for rotating the camera device, and after the first preset duration, trigger the second acquisition module;

the second acquisition module is configured to acquire a second image captured by the camera device;

the third acquisition module is configured to acquire gray values of pixels in the second image;

the second determining module is configured to determine pixels whose gray values are larger than a first preset threshold as target pixels; and the second judgment module is configured to determine whether the number of the target pixels is larger than the second preset threshold, and trigger the second sending sub-module if the number of the target pixels is larger than the second preset threshold.

In the present embodiment, the apparatus may further include: a second timing module, a second sending module, a fourth acquisition module, a third determining module and a third judgment module (not shown in the figure), wherein, the second timing module is configured to activate a timer after the second sending sub-module or the fourth sending sub-module sends the instruction for closing the shutter of the camera device, and after the second preset duration, trigger the second sending module;

the second sending module is configured to send an instruction for opening the shutter and acquire a third image captured by the camera device;

the fourth acquisition module is configured to acquire gray values of pixels in the third image;

the third determining module is configured to determine pixels whose gray values are larger than a first preset threshold as target pixels; and the third judgment module is configured to determine whether the number of the target pixels is larger than the second preset threshold, and trigger the second sending sub-module if the number of the target pixels is larger than the second preset threshold.

In the embodiment shown in FIG. 5, it is determined whether there is a powerful light source in an image captured by the camera device based on the number of the target pixels (pixels whose gray values are larger than the first preset threshold) in the image. If so, it is indicated that the photosensitive element in the camera device is aligned with the powerful light source. In this case, the light avoidance instruction is sent, so as to cause the photosensitive element of the camera device to avoid the light source, thereby reducing the damage caused by the powerful light to the photosensitive element of the camera device.

Figure 6:
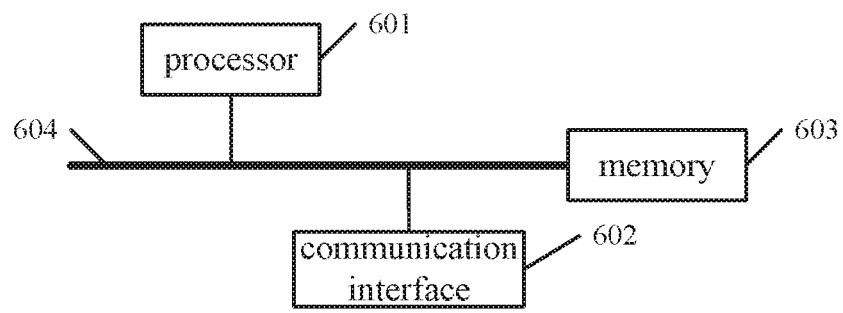
FIG. 6 is a schematic structural diagram of a camera device according to one embodiment.

An embodiment of the disclosure further provides a camera device. As shown in FIG. 6, the camera device includes a processor 601, a communication interface 602, a memory 603 and a communication bus 604, wherein, the processor 601, the communication interface 602, and the memory 603 are communicated with each other via the communication bus 604;

the memory 603 is configured to store a computer program; and the processor 601 is configured to implement any one of the above-described methods for protecting a device under powerful light when executing the program stored in the memory 603.

The camera device further includes a photosensitive element, a shutter, and the like (not shown in the figure). Other components of the camera device are not described in the embodiments of the disclosure any longer.

An embodiment of the disclosure further provides a computer readable storage medium. The computer readable storage medium stores a computer program therein. The computer program, when executed by a processor, implements any one of the above-described methods for protecting a device under powerful light.

An embodiment of the disclosure further provides a computer program. The computer program, when executed by a processor, implements any one of the above-described methods for protecting a device under powerful light.

It should be noted that the relationship terms used here, such as "first", "second" and the like are only used to distinguish one entity or operation from another entity or operation, but do not necessarily require or imply that there is actual relationship or order between these entities or operations. Moreover, the terms "include", "comprise", or any variants thereof are intended to cover a non-exclusive inclusion, such that processes, methods, articles, or devices, including a series of elements, include not only those elements that have been listed, but also other elements that have not specifically been listed or the elements intrinsic to these processes, methods, articles, or devices. Without further limitations, elements limited by the wordings "comprise(s) a/an . . . " and "include(s) a/an" do not exclude additional identical elements in the processes, methods, articles, or devices, including the listed elements.

All of the embodiments in the description are described in a correlated manner, and identical or similar parts in various embodiments can refer to one another. In addition, the description for each embodiment focuses on the differences from other embodiments. In particular, for the embodiment of the apparatus for protecting a device under powerful light shown in FIG. 5, the embodiment of the camera device shown in FIG. 6, the embodiment of the above-described computer readable storage medium, the embodiment of the above-described computer program are described briefly since they are basically similar to the embodiment of the method for protecting a device under powerful light shown in FIGS. 1-4. And the related contents can refer to the description of the embodiment of the method for protecting a device under powerful light shown in FIGS. 1-4.

It can be understood by a person skilled in the art that all or a part of steps in the implementations of the above method can be accomplished by instructing related hardware through programs, which can be stored in a computer-readable storage medium, such as in ROM/RAM, a disk, an optical disk, and so on.

The embodiments described above are simply preferable embodiments of the disclosure, and are not intended to limit the scope of protection of the disclosure. Any modifications, alternatives, improvements, or the like within the spirit and principle of the disclosure shall be included within the scope of protection of the disclosure.

The invention claimed is:

1. A method for protecting a camera device under powerful light, comprising:
    acquiring a gray value of each of pixels in a first image captured by the camera device;
    determining pixels, in the first image, whose gray values are larger than a first preset threshold as target pixels;
    determining whether the number of the target pixels is larger than a second preset threshold; and
    sending a light avoidance instruction if the number of the target pixels is larger than the second preset threshold, wherein the light avoidance instruction is an instruction for rotating the camera device or an instruction for closing a shutter of the camera device, wherein sending the light avoidance instruction comprises: sending the instruction for rotating the camera device so as to cause the camera device to rotate in a direction away from a light source; or, sending the instruction for closing the shutter of the camera device so as to close the shutter to shield a photosensitive element of the camera device;
    wherein sending the instruction for rotating the camera device comprises:
    determining, in the first image, an image region whose gray value is larger than a third preset threshold as a position of the light source in the first image:
    determining a rotation path of the camera device away from the light source based on the position of the light source in the first image; and
    sending the instruction for rotating the camera device which carries information of the rotation path, so as to cause the camera device to rotate in the direction away from the light source based on the information of the rotation path.

2. The method of claim 1, wherein sending the light avoidance instruction comprises:
    determining whether the camera device is rotatable;
    if the camera device is rotatable, sending the instruction for rotating the camera device so as to cause the camera device to rotate in the direction away from the light source;
    if the camera device is not rotatable, sending the instruction for closing the shutter of the camera device so as to close the shutter of the camera device.

3. The method of claim 2, wherein determining whether the camera device is rotatable comprises:
    determining whether a rotation component is provided in the camera device;
    or, reading hardware configuration information of the camera device, and determining whether the camera device is rotatable based on the hardware configuration information.

4. The method of claim 2, wherein after sending the instruction for rotating the camera device, the method further comprises:
    activating a timer, and after a third preset duration, sending a return instruction, wherein the return instruction carries information of a return path, so as to cause the camera device to return to an initial position based on the information of the return path, and the initial position is a position where the camera device is located before rotating based on the information of the rotation path.

5. The method of claim 2, wherein after sending the instruction for closing the shutter of the camera device, the method further comprises:
    activating a timer, and after a second preset duration, sending an instruction for opening the shutter, and acquiring a third image captured by the camera device:
    acquiring gray values of pixels in the third image;
    determining pixels whose gray values are larger than the first preset threshold as target pixels;
    determining whether the number of the target pixels is larger than the second preset threshold; and
    if the number of the target pixels is larger than the second preset threshold, sending the instruction for closing the shutter of the camera device.

6. The method of claim 1, wherein after sending the instruction for rotating the camera device, the method further comprises:
    activating a timer, and after a third preset duration, sending a return instruction, wherein the return instruction carries information of a return path, so as to cause the camera device to return to an initial position based on the information of the return path, and the initial position is a position where the camera device is located before rotating based on the information of the rotation path.

7. The method of claim 1, wherein after sending the instruction for closing the shutter of the camera device, the method further comprises:
    activating a timer, and after a second preset duration, sending an instruction for opening the shutter, and acquiring a third image captured by the camera device;
    acquiring gray values of pixels in the third image;
    determining pixels whose gray values are larger than the first preset threshold as target pixels;
    determining whether the number of the target pixels is larger than the second preset threshold; and
    if the number of the target pixels is larger than the second preset threshold, sending the instruction for closing the shutter of the camera device.

8. A camera device, comprising a processor, a communication interlace, a memory and a communication bus: wherein the processor, the communication interface, and the memory are communicated with each other via the communication bus;

the memory is configured to store a computer program; and the processor is configured to implement the method of claim 1 when executing the computer program stored in the memory.

9. A non-transitory computer readable storage medium storing a computer program which, when executed by a processor, cause the processor to perform a method for protecting a camera device under powerful light, wherein the method comprises:

acquiring a gray value of each of pixels in a first image captured by the camera device;

determining pixels, in the first image, whose gray values are larger than a first preset threshold as target pixels;

determining whether the number of the target pixels is larger than a second preset threshold; and sending a light avoidance instruction if the number of the target pixels is larger than the second preset threshold, wherein the light avoidance instruction is an instruction for rotating the camera device or an instruction for closing a shutter of the camera device, wherein sending the light avoidance instruction comprises: sending the instruction for rotating the camera device so as to cause the camera device to rotate in a direction away from a light source; or, sending the instruction for closing the shutter of the camera device so as to close the shutter to shield a photosensitive element of the camera device;

wherein sending the instruction for rotating the camera device comprises:

determining, in the first image, an image region whose gray value is larger than a third preset threshold as a position of the light source in the first image;

determining a rotation path of the camera device away from the light source based on the position of the light source in the first image; and sending the instruction for rotating the camera device which carries information of the rotation path, so as to cause the camera device to rotate m the direction away from the light source based on the information of the rotation path.

\* \* \* \* \*